(12) United States Patent
Richards

(10) Patent No.: US 7,394,368 B2
(45) Date of Patent: Jul. 1, 2008

(54) ELECTRONIC PROXIMITY SWITCH

(75) Inventor: Thomas C. Richards, Libertyville, IL (US)

(73) Assignee: Illinois Tool Works, Inc., Glenview, IL (US)

( * ) Notice: Subject to any disclaimer, the term of this patent is extended or adjusted under 35 U.S.C. 154(b) by 167 days.

(21) Appl. No.: 11/411,713

(22) Filed: Apr. 26, 2006

(65) Prior Publication Data

US 2007/0247299 A1 Oct. 25, 2007

Related U.S. Application Data

(60) Provisional application No. 60/674,787, filed on Apr. 26, 2005.

(51) Int. Cl.
*G08B 13/08* (2006.01)

(52) U.S. Cl. .................................... 340/545.3; 340/562

(58) Field of Classification Search ............. 340/545.3, 340/426.24, 426.25, 426.26, 426.36, 551–554, 340/561, 562, 565, 567; 341/20, 32, 33
See application file for complete search history.

(56) References Cited

U.S. PATENT DOCUMENTS

| 4,016,490 | A |  | 4/1977 | Weckenmann et al. |
| 5,247,281 | A |  | 9/1993 | Facon et al. |
| 5,802,479 | A | * | 9/1998 | Kithil et al. ................. 340/562 |
| 6,445,294 | B1 |  | 9/2002 | McDonnell et al. |
| 6,724,324 | B1 | * | 4/2004 | Lambert ....................... 341/33 |
| 6,995,670 | B2 | * | 2/2006 | Wadlow et al. ............. 340/562 |
| 7,187,282 | B2 | * | 3/2007 | Fergusson ................... 340/567 |
| 2002/0154039 | A1 | * | 10/2002 | Lambert et al. ............... 341/33 |
| 2003/0216817 | A1 |  | 11/2003 | Pudnev |
| 2006/0055585 | A1 | * | 3/2006 | Nagasaku et al. ........ 340/545.3 |
| 2006/0208854 | A1 | * | 9/2006 | Baumgartner et al. .. 340/426.36 |
| 2006/0250143 | A1 | * | 11/2006 | Moon et al. ................. 340/562 |
| 2007/0194878 | A1 | * | 8/2007 | Touge et al. ............ 340/545.3 |

* cited by examiner

*Primary Examiner*—John Tweel, Jr.
(74) *Attorney, Agent, or Firm*—Boyle Fredrickson S.C.

(57) ABSTRACT

An electronic proximity switch employs two oscillators coupled through two electrical paths, one associated with an antenna serving as a proximity switch sensor. Absorption by an object near the antenna changes the coupling between the oscillators producing a dramatic phase shift that may be detected and used for switching purposes.

12 Claims, 2 Drawing Sheets

ELECTRONIC PROXIMITY SWITCH

CROSS-REFERENCE TO RELATED APPLICATIONS

This application claims the benefit of U.S. Provisional Application No. 60/674,787, filed Apr. 26, 2005.

STATEMENT REGARDING FEDERALLY SPONSORED RESEARCH OR DEVELOPMENT

BACKGROUND OF THE INVENTION

The present invention relates to electronic proximity switches, and in particular to an electronic proximity switch which is highly resistant to mechanical and electrical noise and to temperature changes.

Electronic proximity switches may detect the presence of an object, for example, a human hand near a switch plate, to provide an electrical signal that may be used to switch a circuit or activate a mechanism. Unlike a typical mechanical switch, an electronic proximity switch does not require moving parts, such as a button or switch operator, that may wear or break. Because an electronic proximity switch may activate at a distance, it can be more readily sealed against environmental contamination and protected from damage. Further, activation at a distance allows the switch to be activated rapidly without careful hand placement or the need for one's fingers to be free to press a button or the like.

A significant problem with electronic proximity switches is their susceptibility to unintended triggering. This can occur in electronic proximity switches that are used outdoors, such as with automotive door lock applications, where there is a risk that rain or debris carried in the wind could activate the switch. Further, the sensitive electronics of the electronic proximity switch often can be triggered by electromagnetic interference, for example, from electrical appliances, radio transmitters, or lightning discharge. The circuitry of electronic proximity detectors, which must measure small changes in electrical fields, can be sensitive to drift in the value of electronic components of the circuitry caused by aging or changes in temperature. Steps to avoid these problems can increase the complexity and cost of the electronic proximity switch, rendering it impractical for many consumer applications.

BRIEF DESCRIPTION OF THE DRAWINGS

FIG. 3 is a set of graphs of electrical voltage as a function of time at various points in the schematic diagram of FIG. 2 for the two cases, the first when the electronic proximity switch senses the presence of a hand or the like, and the second when the electronic proximity switch does not sense the presence of a hand or the like.

SUMMARY OF THE INVENTION

Figure 1:
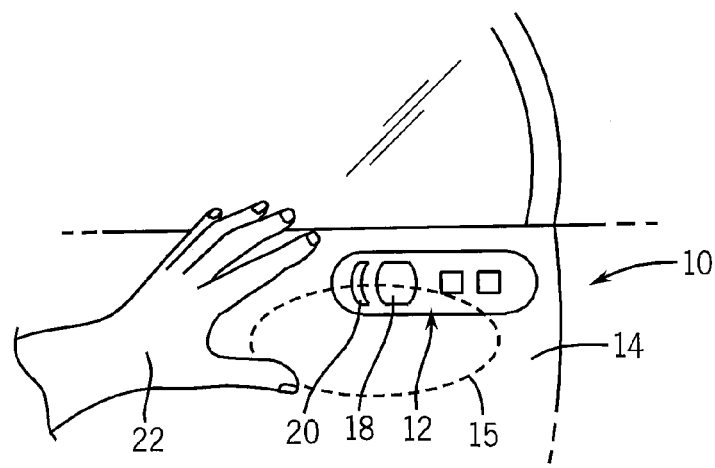
FIG. 1 is perspective view of a faceplate of an automotive lock that may use the proximity switch of the present invention.

The present invention provides a simple electronic proximity switch that is highly resistant to false triggering and to changes in component values over time or with temperature. Generally, the invention transmits an oscillator signal along two paths and then compares the relative strength of the signal along those paths. One path passes through an antenna that may couple with a sensed object to reduce the strength of the signal along that path. The use of two paths neutralizes the effect of any change in the signal strength from the oscillator that would affect the signal in both paths equally, allowing the circuit to be highly sensitive to changes caused by the sensed object.

Preferably, the comparison of the signals from the two paths is done with a second oscillator that is electrically identical to the first oscillator, so that component drift and aging affects both oscillators similarly, allowing the oscillators to track closely. The second oscillator may compare the signals of the two signal paths by giving the signals of each path different phase shifts. The second oscillator identifies the dominant signal by its greater amplitude and oscillates sympathetically with this dominant signal—the phase indicating the relative strength of the signals on the two paths. The second oscillator provides highly selective frequency and phase discrimination, rejecting external noise signals.

Specifically, the present invention provides an electronic proximity switch having an oscillator providing an electrical signal along a first and second transmission path between the oscillator and a signal strength comparator. The first transmission path communicates with a sensor antenna for a free space transmission of the electrical signal in a sensor region and the second transmission path is shielded from the sensor region. A signal strength comparator provides a switch output determined by a relative strength of the electrical signal received over the first and second transmission paths.

Thus, it is one object of at least one embodiment of the invention to provide a simple and robust circuit that is relatively insensitive to changes in the absolute strength of the oscillator signal.

At least one of the first and second transmission paths may include a phase shift element and the comparator may be a second oscillator coupling to both the first and second transmission paths to adopt a phase of the combined electrical signals so that the switch may detect the phase of the second oscillator to determine a dominant signal path.

It is thus another object of at least one embodiment of the invention to provide a highly frequency selective method of comparing signals on the two paths.

The relative phase shift between the first and second transmission paths is 180 degrees.

Thus, it is another object of at least one embodiment of the invention to provide a "snap action" in the shifting of the frequency of the second oscillator such as provides clean switching. The second oscillator will remain oscillating at one phase until the relative strength of the signals along the first and second transmission paths changes, and then will abruptly shift phase.

The first and second oscillators may have identical components and may be tuned to a same frequency.

Thus, it is another object of at least one embodiment of the invention to provide a simple method of negating the effects of component tolerances and thermal drift and aging through the use of identical oscillator and detector circuits.

The phase shift element in the second transmission path may be a capacitor providing 180 degrees of phase shift.

It is thus another object of at least one embodiment of the invention to provide a simple method of coupling the two oscillators to provide a default state.

The phase shift element in the first transmission path may be an electrical inverter and a capacitor formed by the antenna.

It is thus another object of at least one embodiment of the invention to provide a secondary coupling between the oscillators that allows signals along the two signal paths to be distinguished by phase shift.

The signal strength comparator further receives the signal from the first oscillator to determine a phase of the second oscillator It is thus another object of at least one embodiment of the invention to provide a phase sensitive comparison that further reduces the effects of external electromagnetic interference.

The antenna structure may be at least two electrodes electrically insulated from each other, one attached to the first oscillator, and one attached to the second oscillator.

It is another object of at least one embodiment of the invention to provide a simple antenna structure that can be placed on a variety of surfaces.

The two electrodes may be attached to an automotive door handle.

It is another object of at least one embodiment of the invention to provide a switch suitable for activating the courtesy lights or the like of an automobile.

The electronic proximity switch may include a timing element requiring a given relative strength between the electrical signals of the two transmission paths of a predetermined duration before the switch output is activated.

It is yet another object of at least one embodiment of the invention to provide a switch that is resistant to short-term interference, for example, rain drops or debris in the air.

These particular objects and advantages may apply to only some embodiments falling within the claims and thus do not define the scope of the invention.

DETAILED DESCRIPTION OF THE PREFERRED EMBODIMENT

Referring now to FIG. 1, the present invention provides a electronic proximity switch 10 that may, for example, form part of a keyless entry system on an automobile or the like.

In this embodiment, the proximity switch 10 provides an antenna 12 formed as part of a handle escutcheon on an automobile door 14. The antenna 12 provides a first conductive plate 18 insulated from, but adjacent to, a second conductive plate 20, both of which may be visible or covered beneath a plastic face of the escutcheon. A person's hand 22 approaching the antenna 12 disrupts an electrical field 15 extending between the conductive plate 18 and the second conductive plate 20. Disruption of the electrical field is sensed to produce an electrical signal that may be used to actuate a door release mechanism or the like.

Figure 2:
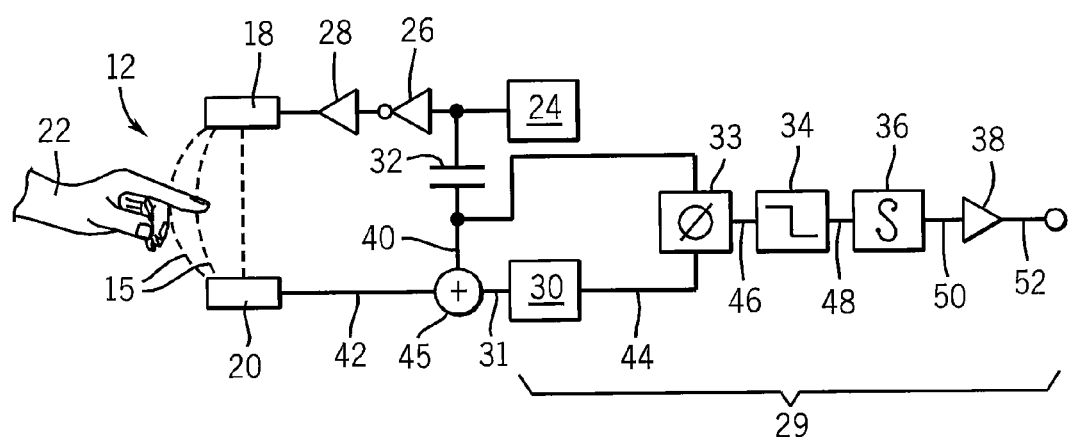
FIG. 2 is a schematic diagram of the principal elements of the proximity switch of FIG. 1.

Referring now to FIG. 2, the conductive plate 18 and second conductive plate 20 are part of a first conductive path extending between oscillator 24 and oscillator 30 and further including inverter 26, amplifier 28 and summing node 45. The oscillator 24 operates to produce a megahertz signal, for example, a square wave or sine wave output, preferably at about 1.3 MHz. The output from the oscillator 24 passes through inverter 26 to change the phase of the output by 180 degrees, and then through amplifier 28 providing sufficient power to produce a sufficiently strong electrical field 15 between conductive plate 18 and conductive plate 20. The signal 42 from conductive plate 20 is received by a first input of a summing node 45 and then by the input of an oscillator 30.

A second conductive path between oscillator 24 and oscillator 30 is provided by a coupling capacitor 32 that receives the output of oscillator 24 and provides a signal 40 to a second input of the summing node 45 to be summed with the signal 42 from the plate 20 and provided to the input of oscillator 30. The coupling capacitor 32 is sized so that the relative phase shift between the first transmission path to the summing node 45 and the second transmission path to the summing node is substantially 180 degrees.

Figure 3:
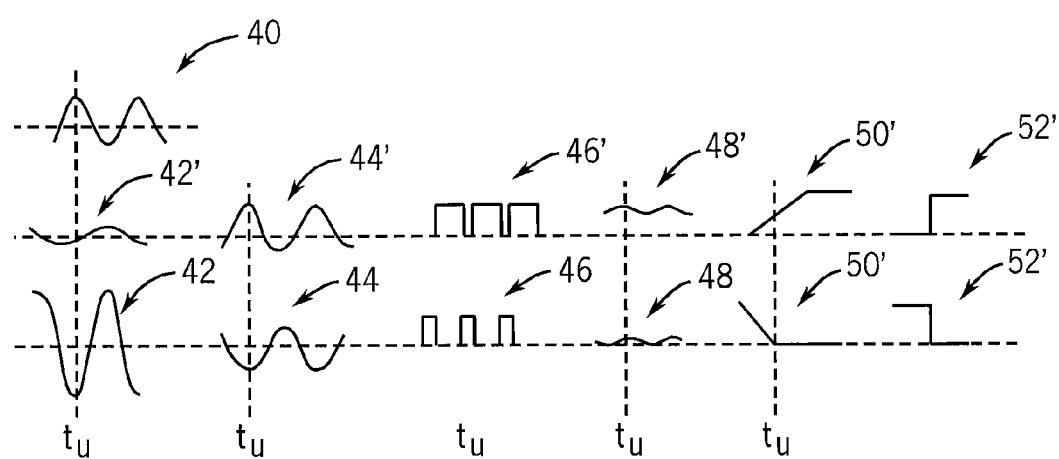

Referring now also to FIG. 3, the two transmission paths between the oscillator 24 and oscillator 30 are initially set up by adjustment of the plates 18 and 20, or the introduction of an attenuating element, such as a resistor (not shown) so that the signal 42 passing through conductive plate 18 and second conductive plate 20 in the first path is much stronger than the signal 40 passing through capacitor 32 in the second path so that an output 44 of the oscillator 30 is in phase with signal 42. For this reason, the output signal from the summing node 45, as it passes to the input of the oscillator 30, will be 180 degrees out of phase with the signal 40—the phase indicating the relative strength of the signals on the two paths.

Electrically, the relative strength of the signals on the two paths is determined by a signal strength comparator 29 formed of oscillator 30, phase detector 33, low pass filter 34, integrator/charge pump 36 and output amplifier 38, as will now be described.

Oscillator 30 is preferably electrically identical to oscillator 24, having the same operating frequency as oscillator 24 and using the same design and component values. In this way, the natural frequency of the oscillators 30 and 24 will tend to be the same with changes in temperature and as components age. The input of the oscillator 30 may be any point in the oscillator circuit where a signal equal in frequency to that of the oscillators 24 and 30 and provided to that input will tend to shift the phase of the oscillator 30 to the phase of the signal by way of sympathetic oscillation. It will be recognized that oscillator 30 acts as a narrow band filter, and thus is largely immune to spurious noise outside of the frequency of oscillator 24 to provide a high degree of noise rejection.

Signal 40 and the output oscillator 30 are then compared by a phase detector 33, for example, a multiplier circuit, or for a square wave signal 40, an exclusive NOR gate whose output tends to a high state when the signal 40 and the output oscillator 30 are in-phase and a low state when signal 40 and the output oscillator 30 are out of phase. In this case, when the person's hand 22 is not present, the signal 40 and the output oscillator 30 will be out of phase and the signal 46 will be generally low.

Small phase errors, electrical noise, or interference like rain will cause minor high state excursions in signal 46 whose output is filtered by a low pass filter 34 to produce signal 48 approximating a rolling time average of signal 46 and being generally in a low state. This signal 48 is provided to a charge pump 36 which produces a falling integrated output 50 that may be provided to an output amplifier 38, for example a Schmidt trigger, to provide a low state output signal 52 indicating that a person's hand 22 is not close to the conductive plates 18 and 20. These stages tend to reject noise that is not in phase or 180 out of phase with signal 40 and to reject the momentary phase errors described above.

When a person's hand 22 is brought near the conductive plate 18, the coupling between the conductive plate 18 and the second conductive plate 20 is weakened causing the coupling through capacitor 32 to provide the dominant signal causing the signal 40 and the output 44' of oscillator 30 to be in phase. The relative coupling between the oscillators 24 and 30 along the first and second transmission paths can be used to adjust the distance at which the hand 22 triggers this in phase condition.

Again, signal 40 and the output oscillator 30 are compared by a phase detector 33 which will produce a generally high state signal 46', which is provided to the low pass filter 34 to produce signal 48' and then to the charge pump 36 to produce a rising integrated output 50' that may be provided to an output amplifier 38 to provide a high state output signal 52' indicating that a person's hand 22 is close to the conductive plates 18 and 20. This signal 52' may be used to trigger a switch or a mechanical lock or a courtesy light or the like.

The present invention is not limited for use in automobiles, but may be used in appliances, such as washing machines and the like. By changing the relative phase between signals 42 and 40 to less than 180 degrees, the output of the summing node 45 will vary continuously with changes in relative signal's strength. This continuous output can be used to provide distance detection.

It is specifically intended that the present invention not be limited to the embodiments and illustrations contained herein, but includes modified forms of those embodiments, including portions of the embodiments and combinations of elements of different embodiments as come within the scope of the following claims.

I claim:

1. An electronic proximity switch comprising:
   an oscillator providing an electrical signal;
   a signal strength comparator;
   a sensor antenna providing for a free space transmission of the electrical signal;
   a first and second transmission path between the oscillator and the signal strength comparator, the first transmission path communicating with the sensor antenna for a free space transmission of the electrical signal in a sensor region and the second transmission path being shielded from the sensor region;
   wherein the signal strength comparator further provides a switch output determined by a relative strength of the electrical signal received over the first and second transmission paths.

2. The electronic proximity switch of claim 1 wherein at least one of the first and second transmission paths includes a phase shift element and wherein the signal strength comparator is a second oscillator coupling to both the first and second transmission paths to adopt a phase of a dominant electrical signal of one of the first and second transmission paths and wherein the signal strength comparator detects the phase of the second oscillator.

3. The electronic proximity switch of claim 2 wherein the relative phase shift between the first and second transmission path is 180 degrees.

4. The electronic proximity switch of claim 2 wherein the first and second oscillators have identical components.

5. The electronic proximity switch of claim 2 wherein the first and second oscillators are tuned to a same frequency.

6. The electronic proximity switch of claim 2 wherein the phase shift element is a capacitor in the second transmission path.

7. The electronic proximity switch of claim 2 wherein the phase shift element is an electrical inverter and a capacitor formed by the antenna in the first transmission path providing a net of zero degrees of phase shift.

8. The electronic proximity switch of claim 2 wherein the signal strength comparator further receives the signal from the first oscillator to determine a phase of the second oscillator.

9. The electronic proximity switch of claim 1 wherein the antenna structure is at least two electrodes electrically insulated from each other, one attached to the first oscillator and one attached to the second oscillator.

10. The electronic proximity switch of claim 9 wherein the two electrodes are attached to an automotive door handle.

11. The electronic proximity switch of claim 1 wherein the signal strength comparator includes a timing element requiring a given relative strength between the electrical signals of the two transmission paths of a predetermined duration before the switch output is activated.

12. A proximity detector comprising:
    an oscillator;
    a phase and frequency sensitive detector;
    a first and second transmission path between the oscillator and the phase and frequency sensitive detector, the first transmission path providing a predetermined first phase shift, and the second transmission path providing a predetermined second phase shift;
    an antenna structure causing a shift of a relative strength of signals along the first and second transmission paths; and
    a switch circuit communicating with the phase and frequency sensitive detector to detect a dominant signal along one of the first and second transmission paths according to a phase and frequency detected by the phase and frequency sensitive detector, and to switch when the dominant signal changes between the first and second transmission paths.

* * * * *